US009704918B2

(12) United States Patent
Miyakawa et al.

(10) Patent No.: US 9,704,918 B2
(45) Date of Patent: *Jul. 11, 2017

(54) SEMICONDUCTOR STORAGE DEVICE

(71) Applicants: Tadashi Miyakawa, Yokohama (JP);
Katsuhiko Hoya, Yokohama (JP);
Mariko Iizuka, Yokohama (JP);
Takashi Nakazawa, Seongnam-si (KR);
Hiroyuki Takenaka, Kamakura (JP)

(72) Inventors: Tadashi Miyakawa, Yokohama (JP);
Katsuhiko Hoya, Yokohama (JP);
Mariko Iizuka, Yokohama (JP);
Takashi Nakazawa, Seongnam-si (KR);
Hiroyuki Takenaka, Kamakura (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/048,735

(22) Filed: Feb. 19, 2016

(65) Prior Publication Data

US 2016/0197120 A1    Jul. 7, 2016

Related U.S. Application Data

(63) Continuation of application No. 14/201,642, filed on Mar. 7, 2014, now Pat. No. 9,299,409.

(Continued)

(51) Int. Cl.
*G11C 13/00* (2006.01)
*H01L 27/22* (2006.01)
(Continued)

(52) U.S. Cl.
CPC .............. *H01L 27/228* (2013.01); *G11C 7/12* (2013.01); *G11C 11/161* (2013.01);
(Continued)

(58) Field of Classification Search
CPC ............ G11C 13/0002; G11C 13/0004; G11C 13/0026; G11C 7/12; G11C 11/1675;
(Continued)

(56) References Cited

U.S. PATENT DOCUMENTS 5,305,252 A    4/1994 Saeki
5,539,698 A    7/1996 Suzuki
(Continued)

FOREIGN PATENT DOCUMENTS

CN    1963946 A    5/2007
EP    0464686 A1   1/1992
(Continued)

OTHER PUBLICATIONS

Related U.S. Appl. No. 14/475,126; First Named Inventor: Tadashi Miyakawa; Title: "Semiconductor Storage Device"; filed Sep. 2, 2014.

(Continued)

*Primary Examiner* — Tan T. Nguyen
(74) *Attorney, Agent, or Firm* — Holtz, Holtz & Volek PC

(57)    ABSTRACT

A semiconductor storage device includes a cell array including resistance change elements formed above a semiconductor substrate; first cell transistors formed on the semiconductor substrate and provided in association with the resistance change elements; first gate electrodes included in the first cell transistor and extending in a first direction; a first bit lines electrically connected to the resistance change elements respectively and extending in a second direction perpendicular to the first direction; a second bit lines electrically connected to one end of a current path of the first cell transistors respectively and extending in the second direction; and first active areas in which the first cell transistors are formed, and which extend in a direction crossing the first direction at a first angle.

20 Claims, 13 Drawing Sheets

Related U.S. Application Data

(60) Provisional application No. 61/876,491, filed on Sep. 11, 2013.

(51) Int. Cl.
*G11C 11/16* (2006.01)
*G11C 7/12* (2006.01)
*H01L 43/08* (2006.01)

(52) U.S. Cl.
CPC ...... *G11C 11/1653* (2013.01); *G11C 11/1655* (2013.01); *G11C 11/1659* (2013.01); *G11C 11/1675* (2013.01); *H01L 43/08* (2013.01); *G11C 13/0002* (2013.01)

(58) Field of Classification Search
CPC ............ G11C 11/1655; G11C 11/1653; G11C 11/161; G11C 11/1659; H01L 43/08; H01L 27/228
USPC .................................. 365/158, 63, 148, 163
See application file for complete search history.

(56) References Cited

U.S. PATENT DOCUMENTS

| | | | | |
|---|---|---|---|---|
| 5,793,666 | A * | 8/1998 | Yamazaki | G11C 17/126 365/104 |
| 5,794,666 | A * | 8/1998 | Yanagawa | F17C 5/06 123/527 |
| 6,058,053 | A | 5/2000 | Tsuji et al. | |
| 7,436,704 | B2 | 10/2008 | Kim et al. | |
| 8,711,602 | B2 | 4/2014 | Watanabe et al. | |
| 8,824,187 | B2 | 9/2014 | Park | |
| 8,837,251 | B2 * | 9/2014 | Kawahara | G11C 11/16 365/148 |
| 2002/0057605 | A1 | 5/2002 | Yamakoshi | |
| 2003/0235071 | A1 | 12/2003 | Okazawa | |
| 2004/0184331 | A1 | 9/2004 | Hanzawa et al. | |
| 2008/0025072 | A1 * | 1/2008 | Tamai | G11C 8/10 365/148 |
| 2008/0308887 | A1 | 12/2008 | Asao et al. | |
| 2010/0202185 | A1 * | 8/2010 | Katoh | G11C 13/00 365/148 |
| 2010/0280058 | A1 * | 11/2010 | Dolle | C07D 221/20 514/278 |
| 2012/0043630 | A1 | 2/2012 | Omori et al. | |
| 2012/0155146 | A1 | 6/2012 | Ueda et al. | |
| 2012/0193601 | A1 | 8/2012 | Tsukamoto | |
| 2012/0286339 | A1 | 11/2012 | Asao | |
| 2014/0092665 | A1 * | 4/2014 | Ueda | G11C 13/0002 365/63 |
| 2014/0241041 | A1 * | 8/2014 | Lee | G11C 13/004 365/148 |

FOREIGN PATENT DOCUMENTS

| | | |
|---|---|---|
| JP | 09231789 A | 9/1997 |
| JP | 2010093277 A | 4/2010 |

OTHER PUBLICATIONS

International Search Report (ISR) including Written Opinion dated Nov. 18, 2014, issued in parent International Application No. PCT/JP2014/072860.
Taiwanese Office Action (and English translation thereof) dated Dec. 22, 2015, issued in counterpart Taiwanese Application No. 103130655.
Chinese Office Action (and English translation thereof) dated May 2, 2017 issued in counterpart Chinese Application No. 201480047769.7.

\* cited by examiner

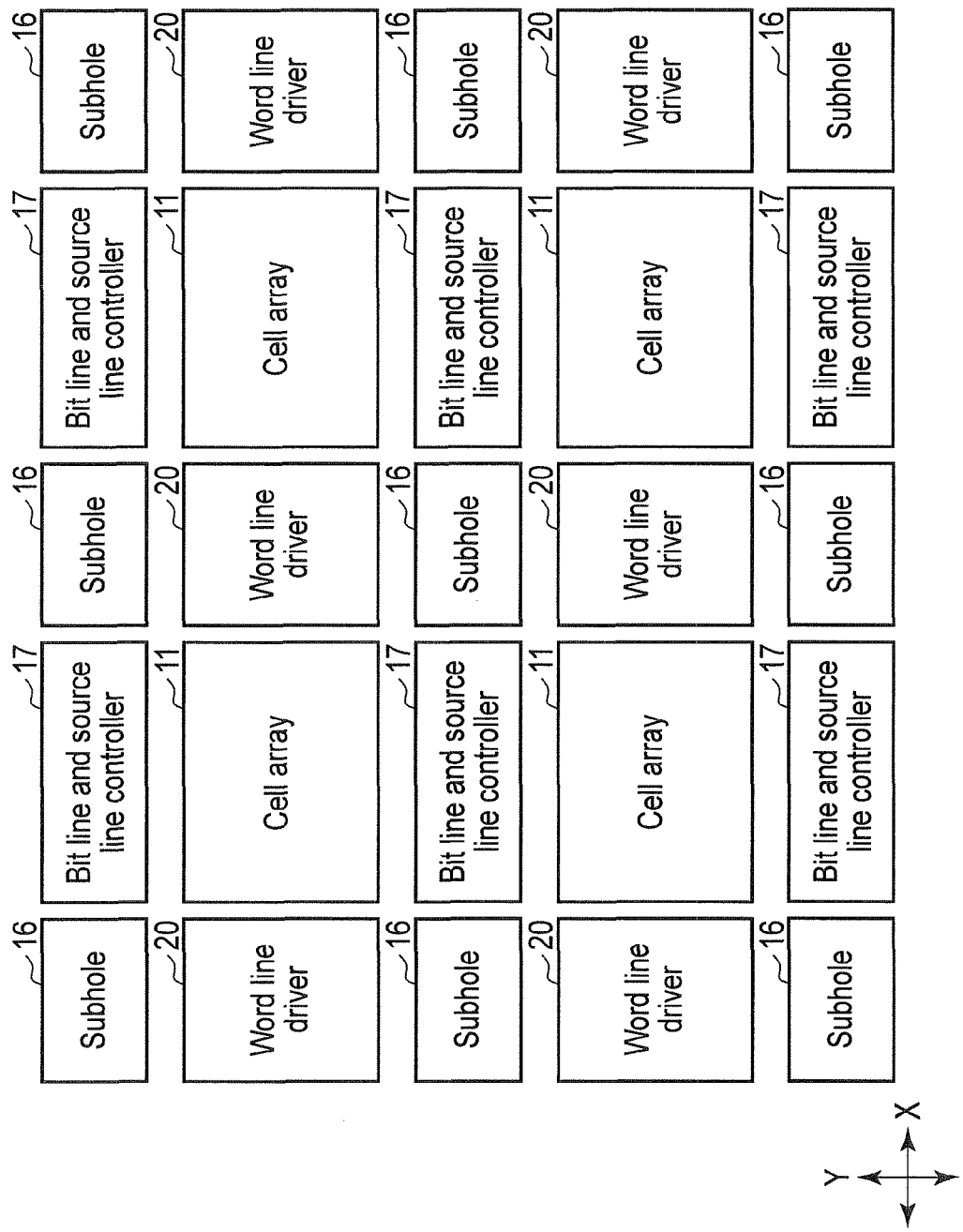
F I G. 3

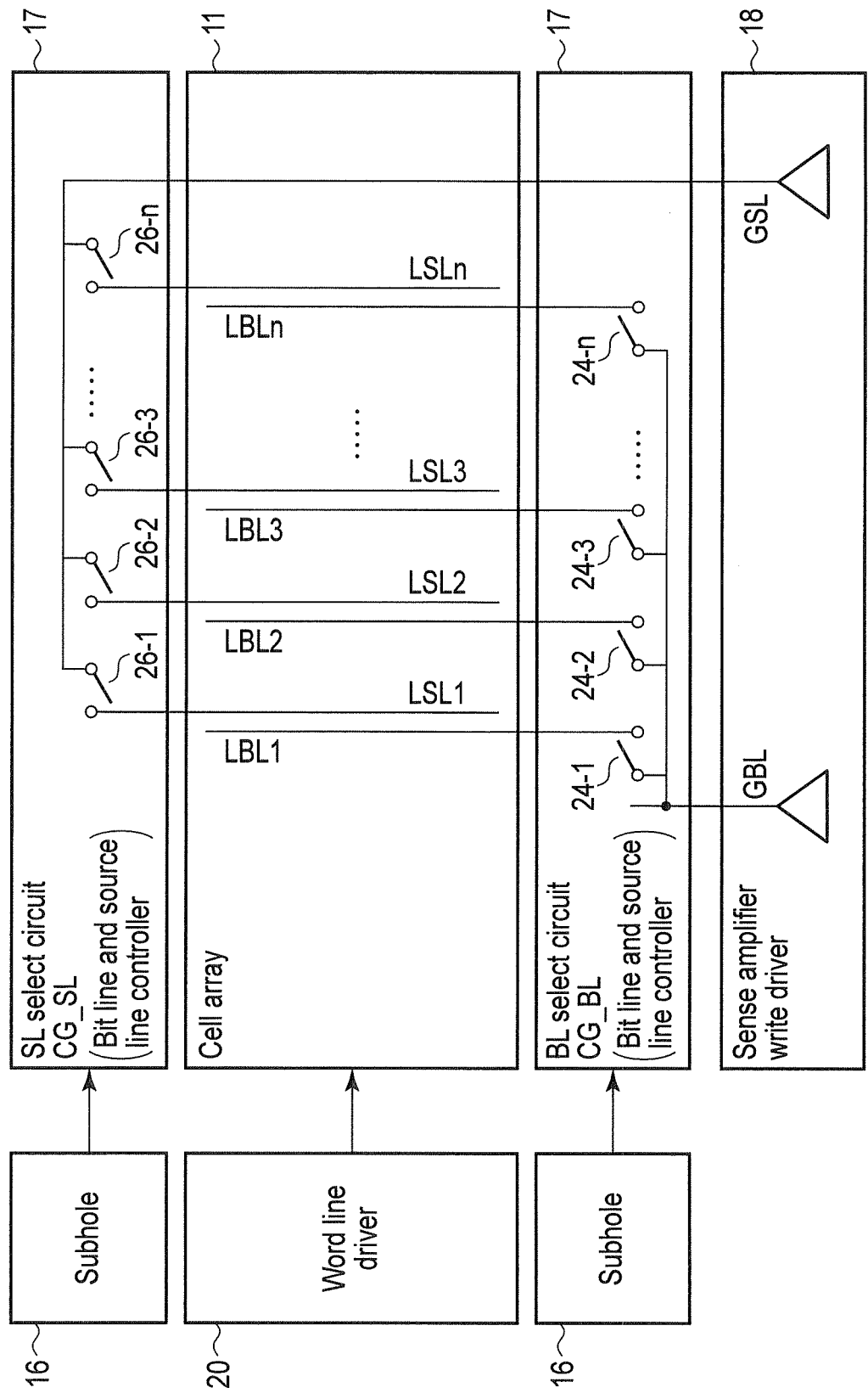
F I G. 4

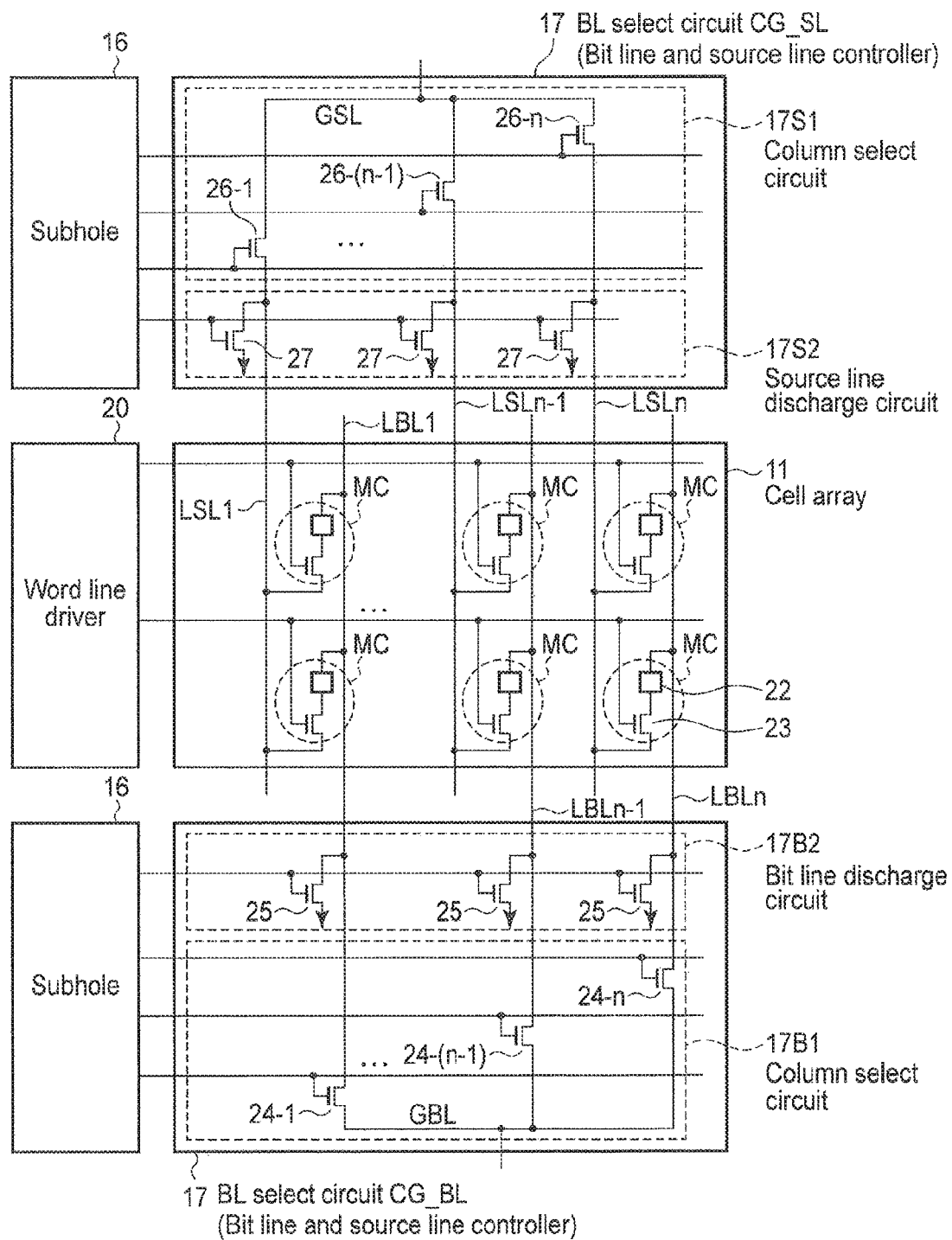
F I G. 5

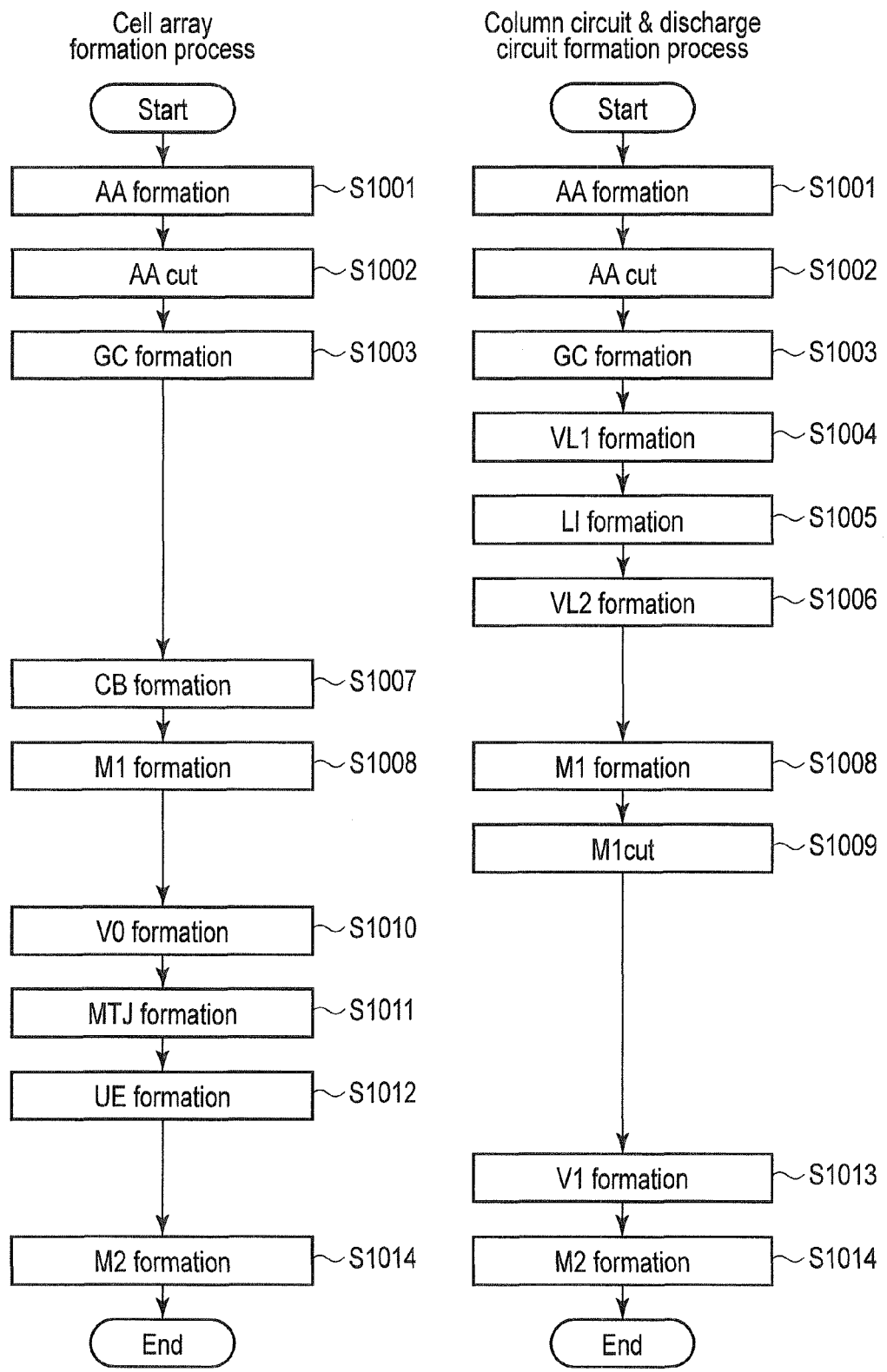
F I G. 12

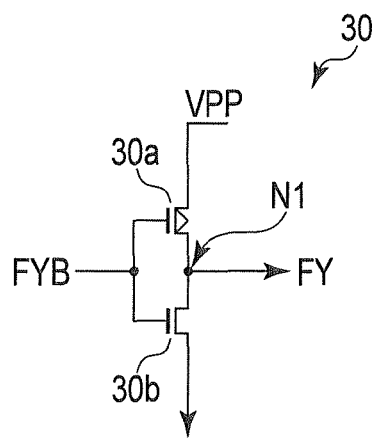
Column select circuit driver (inverter)
F I G. 14A
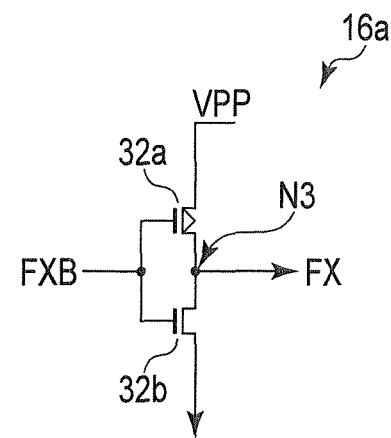
SWD driver
F I G. 14C
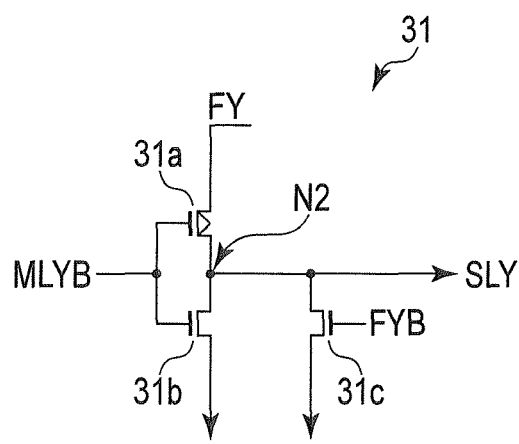
Column select circuit driver (SWD)
F I G. 14B
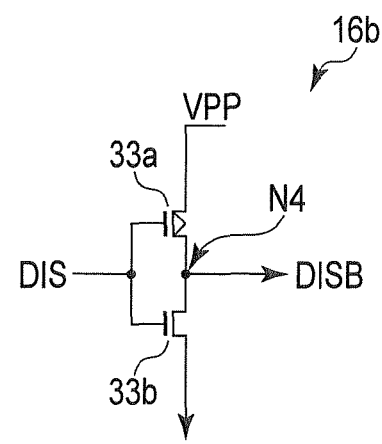
BL/SL reset driver
F I G. 14D

SEMICONDUCTOR STORAGE DEVICE

CROSS REFERENCE TO RELATED APPLICATIONS

This application is a Continuation of U.S. Ser. No. 14/201,642, filed Mar. 7, 2014, which claims the benefit of U.S. Provisional Application No. 61/876,491, filed Sep. 11, 2013, the entire contents of both of which are incorporated herein by reference.

FIELD

Embodiments described herein relate generally to a semiconductor storage device.

BACKGROUND

There is known a magnetic random access memory (MRAM) as one of resistance change type memories. Writing methods of MRAMs include a magnetic field writing method and a spin transfer writing method. Of these methods, the spin transfer method is advantageous in increasing an integration density, reducing power consumption and enhancing capabilities, since this method has such a characteristic that a spin transfer current that is necessary for magnetization reversal decreases as the size of a magnetic body becomes smaller.

An MTJ (Magnetic Tunnel Junction) element of the spin transfer writing method has a multilayer structure which is composed of two ferromagnetic layers and a nonmagnetic barrier layer (insulation thin film) interposed therebetween, and digital data is stored by a change in magnetic resistance due to a spin polarization tunnel effect. The MTJ element may take a low resistance state and a high resistance state by a magnetization orientation of the two ferromagnetic layers. When the magnetization orientation (spin direction) of the two ferromagnetic layers is in a parallel state (P (Parallel) state), the MTJ element is in the low resistance state. When the magnetization orientation of the two ferromagnetic layers is in an antiparallel state (AP (AntiParallel) state), the MTJ element is in the high resistance state.

BRIEF DESCRIPTION OF THE DRAWINGS

FIG. 3 illustrates an example of a layout of a cell array and a peripheral circuit thereof according to the first embodiment.

FIG. 4 is a block diagram illustrating a relationship between the cell array and a bit line and source line controller according to the first embodiment.

FIG. 5 is a circuit diagram illustrating the relationship between the cell array and the bit line and source line controller according to the first embodiment.

FIG. 12 is a flowchart which schematically illustrates a basic manufacturing method of the semiconductor storage device according to the first embodiment.

FIG. 14A is a circuit diagram illustrating an inverter of a column select circuit driver.

FIG. 14B is a circuit diagram illustrating an SWD driver of the column select circuit driver.

FIG. 14C is a circuit diagram of an SWD driver.

FIG. 14D is a circuit diagram of a BL/SL reset driver.

DETAILED DESCRIPTION

Figure 1:
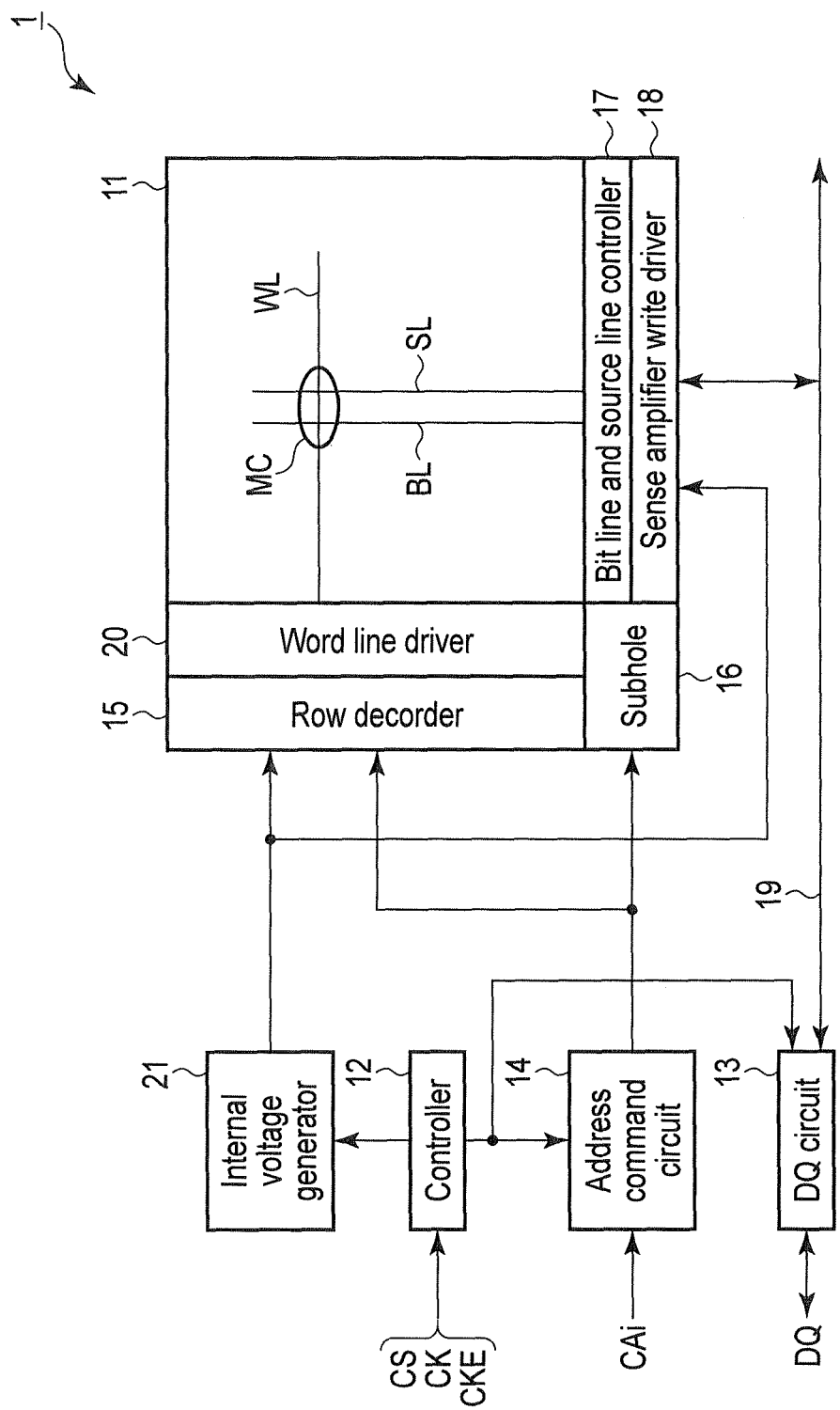
FIG. 1 is a block diagram illustrating a structure of a semiconductor storage device according to a first embodiment.

Also in a resistance change type memory which can realize fine cells as described in the "BACKGROUND", an adequate cell capability cannot be derived by simply enlarging a memory cell array area, owing to an increase in resistance of a wiring layer by microfabrication. It is thus necessary to divide the cell array, thereby decreasing the influence of the increase in wiring resistance. To divide the cell array means to increase the number of core circuits around the cell array, leading simply to an increase in chip size. In the present application, the area of the core circuit is reduced by using a miniaturization technique of memory cells for the core circuit around the memory cell array, thereby realizing a resistance change type memory device which has an improved capability and margin, while suppressing an increase in chip size.

In general, according to one embodiment, a semiconductor storage device includes a cell array including a plurality of resistance change elements formed above a semiconductor substrate, a plurality of first cell transistors formed on the semiconductor substrate and provided in association with the resistance change elements, a plurality of first gate electrodes included in the first cell transistor and extending in a first direction, a first bit line electrically connected to the resistance change element and extending in a second direction perpendicular to the first direction, a second bit line electrically connected to one end of a current path of the first cell transistor and extending in the second direction, and a plurality of first active areas in which the first cell transistors are formed, and which extend in a direction crossing the first direction at a first angle. The semiconductor storage device also includes a bit line controller including a plurality of second cell transistors formed on the semiconductor substrate and each having a current path with one end electrically connected to the first bit line or the second bit line, a plurality of second gate electrodes included in the second cell transistors and extending in the first direction, and a plurality of second active areas in which the second cell transistors are formed, and which extend in a direction crossing the first direction at a second angle.

Hereinafter, embodiments, which have been constructed, will be described with reference to the accompanying drawings. In the description below, structural elements having substantially the same functions and structures are denoted by like reference signs, and an overlapping description is given only where necessary. The "alphabet" or "hyphen & numeral" after a numeral, which constitutes a reference sign, and the "numeral" or "hyphen & numeral" after a symbol, which constitutes a reference sign, are used in order to distinguish elements which are referred to by reference signs including the same numeral and have the same structure. When it is not necessary to distinguish elements which are indicated by reference signs including the same numeral, these elements are referred to by a reference sign including only a numeral or a symbol. For example, when it is not necessary to distinguish elements with reference signs 1*a* and 1*b*, these elements are comprehensively referred to by a reference sign 1. In addition, for example, when it is not necessary to distinguish elements with reference signs WL1 and WL2, these elements are comprehensively referred to by a reference sign WL.

It should be noted that the drawings are schematic ones, and the relationship between a thickness and a planar dimension, the ratio in thickness between layers, etc. are different from real ones. Thus, concrete thicknesses and dimensions should be judged in consideration of descriptions below. Needless to say, the drawings include parts with mutually different relations or ratios of dimensions. Besides, embodiments to be described below illustrate, by way of example, devices or methods for embodying technical concepts of the embodiments, and the technical concepts of the embodiments do not specifically restrict the material, shape, structure, arrangement, etc. of structural components to those described below. Various changes may be made in the technical concepts of the embodiments within the scope of the claims.

First Embodiment

<Structure of a Semiconductor Storage Device According to a First Embodiment>

To begin with, referring to FIG. 1, a basic structure of a semiconductor storage device according to a first embodiment is schematically described. FIG. 1 is a block diagram illustrating the structure of the semiconductor storage device according to the first embodiment.

The semiconductor storage device 1 of the first embodiment includes a memory cell array (also referred to simply as "cell array") 11, a controller 12, a DQ circuit 13, an address command circuit 14, a row decoder 15, a subhole 16, a bit line and source line controller 17, a sense amplifier/write driver 18, a word line driver 20, and an internal voltage generator 21. The subhole 16 generates a control signal of the word line driver 20 and a control signal of the bit line and source line controller 14, in association with each memory cell array 11.

The cell array 11 is an MRAM, in which a plurality of memory cells MC are arranged two-dimensionally in a matrix. Each memory cell MC includes an MTJ element 22 (not shown) and a cell transistor 23 (not shown). The MTJ element 22 is a magnetic tunnel junction element which stores data by a change in resistance state, and can rewrite data by an electric current. The cell transistor 23 is provided in association with the MTJ element 22, and is configured to be rendered conducive when a current is caused to flow in the associated MTJ element 22.

A plurality of word lines WL are arranged in a row direction and a plurality of bit lines BL are arranged in a column direction such that the word lines WL and bit lines BL cross each other. Two neighboring bit lines BL constitute a pair, and the memory cell MC is provided in association with an intersection between the word line WL and the bit line pair (in this embodiment, for convenience' sake, referred to as a bit line BL and a source line SL). The MTJ element 22 and cell transistor 23 of each memory cell MC are connected in series between the bit line pair (e.g. between BL and SL). In addition, the gate of the cell transistor 23 is connected to the word line WL.

Various external control signals, for instance, a chip select signal CS, a clock signal CK and a clock enable signal CKE, are input to the controller 12. The controller 12 controls the address command circuit 14, and discriminates an address and a command.

A command address signal CAi is input to the address command circuit 14. The address command circuit 14 transfers the command address signal CAi to the row decoder 15 and subhole 16.

The row decoders 15 are disposed on both sides in the word line direction of the memory cell array 11, and decode an address of the command address signal CAi which has been supplied from the address command circuit 14.

The subhole 16 recognizes, based on an external control signal, a command or an address by the command address signal CAi, and controls the word line driver 20 and the bit line and source line controller 17.

The bit line and source line controller 17 are disposed on both sides in the bit line direction of the memory cell array 11, and control the bit line BL and source line SL, based on a control signal from the subhole 16.

The sense amplifier/write driver 18 is disposed in a bit line direction of the memory cell array 11. The sense amplifier is connected to the bit line BL, and reads out data stored in the memory cell by sensing a current flowing in the memory cell MC which is connected to the selected word line WL. The write driver is connected to the bit line BL, and writes data by causing a current to flow in the memory cell MC which is connected to the selected word line WL.

The transmission/reception of data between the sense amplifier/write driver 18 and an external input/output terminal DQ is executed via a data bus 19 and the DQ circuit 13.

The word line drivers 20 are disposed on both sides in the word line direction of the memory cell array 11 and connected to the word lines, and are configured to apply a voltage to the selected word line WL at a time of data read or data write. More specifically, the word line driver 20 is configured to apply a voltage to the selected word line WL, in accordance with a row address decoded by the row decoder 15.

The internal voltage generator 21 is provided in order to generate an internal voltage (e.g. a voltage boosted by a power supply voltage) which is necessary for operations in the semiconductor storage device 1. This internal voltage generator 21, too, is controlled by the controller 12, and executes a boost operation and generates a necessary voltage.

<Write Operation of Memory Cell MC>

Figure 2:
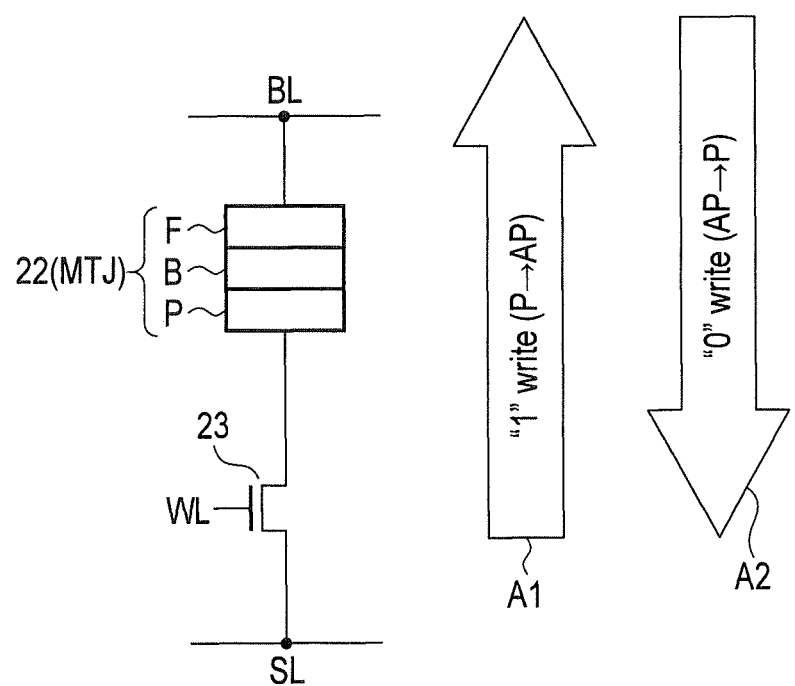
FIG. 2 is a view illustrating a write operation of a memory cell according to the first embodiment.

Next, referring to FIG. 2, a write operation of the memory cell MC according to the first embodiment is schematically described. FIG. 2 is a view illustrating the write operation of the memory cell MC according to the first embodiment.

As illustrated in FIG. 2, one end of an MTJ element 22 of the memory cell MC according to the first embodiment is connected to the bit line BL, and the other end of the MTJ element 22 is connected to one end of a current path of a cell transistor 23. The other end of the current path of the cell transistor 23 is connected to the source line SL. The MTJ element 22, which makes use of a TMR (tunneling magnetoresistive) effect, has a multilayer structure which is composed of two ferromagnetic layers F and P and a nonmagnetic (tunnel insulation film) B interposed therebetween, and stores digital data by a change in magnetic resistance by a spin polarization tunnel effect. The MTJ element 22 may take a low resistance state and a high resistance state by a magnetization orientation of the two ferromagnetic layers F, P. For example, if the low resistance state is defined as data "0" and the high resistance state is defined as data "1", 1 bit data can be stored in the MTJ element 22. Needless to say, the low resistance state may be defined as data "1" and the high resistance state may be defined as data "0".

For example, the MTJ element 22 is configured such that a fixed layer (pin layer) P, a tunnel barrier layer B and a recording layer (free layer) F are successively stacked. The pin layer P and free layer F are formed of a ferromagnetic material, and the tunnel barrier layer B is formed of an insulation film (e.g. $Al_2O_3$, MgO). The pin layer P is a layer with a fixed direction of magnetization orientation. The free layer F has a variable direction of magnetization orientation, and data is stored by the direction of magnetization.

If an electric current is caused to flow in a direction of arrow A1 at a time of write, the magnetization direction of the free layer F is set in an antiparallel state (AP state), relative to the magnetization direction of the pin layer P, and a high resistance state (data "1") is set. If an electric current is caused to flow in a direction of arrow A2 at a time of write, the magnetization directions of the pin layer P and free layer F are set in a parallel state (P state), and a low resistance state (data "0") is set. In this manner, in the MTJ element, different data can be written in accordance with the direction of flow of an electric current.

<Structure of Cell Arrays According to the First Embodiment and Peripheral Circuits Thereof>

Figure 6:
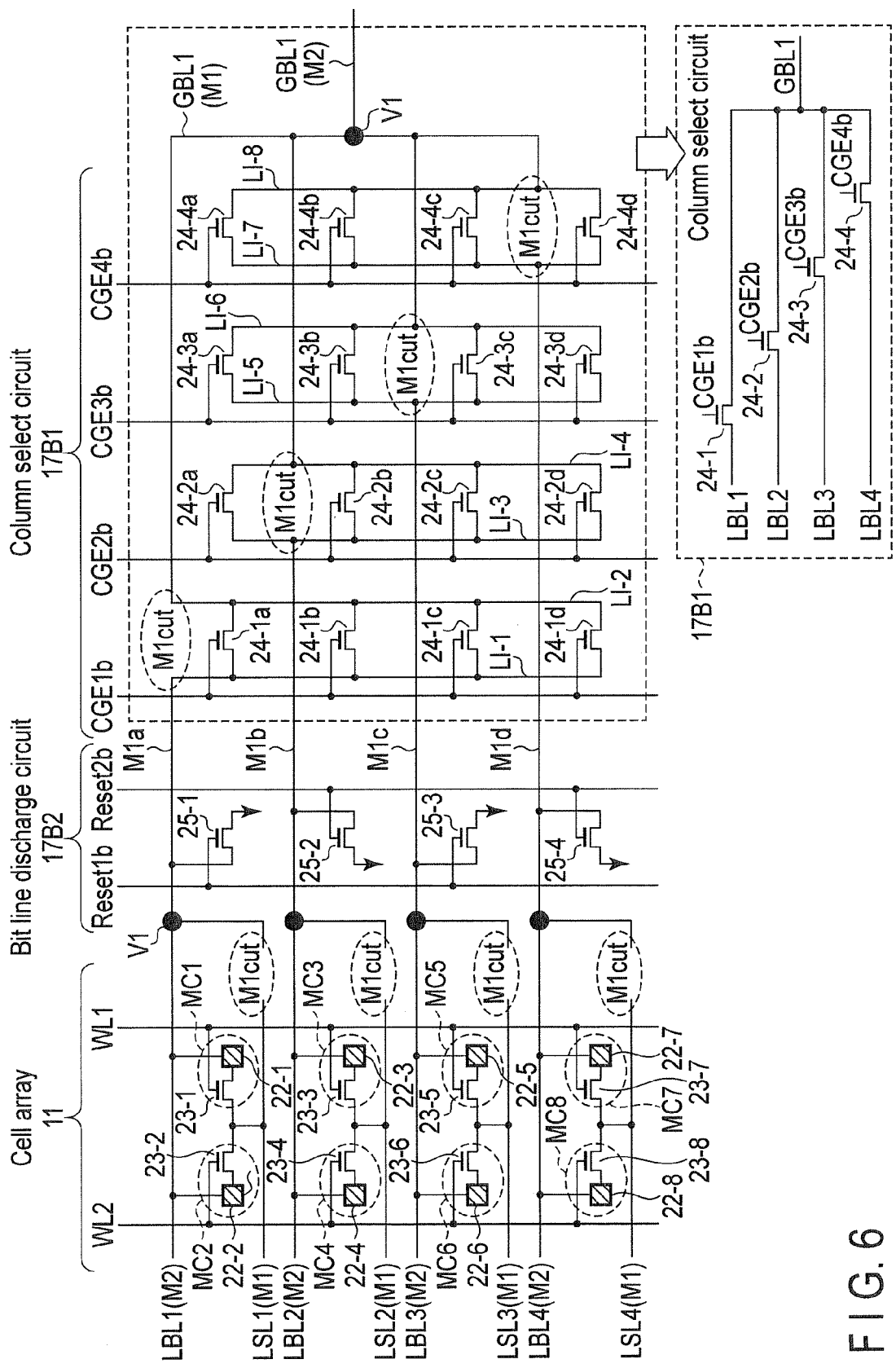
FIG. 6 is a circuit diagram illustrating a relationship between the cell array and a bit line controller according to the first embodiment.
Figure 7:
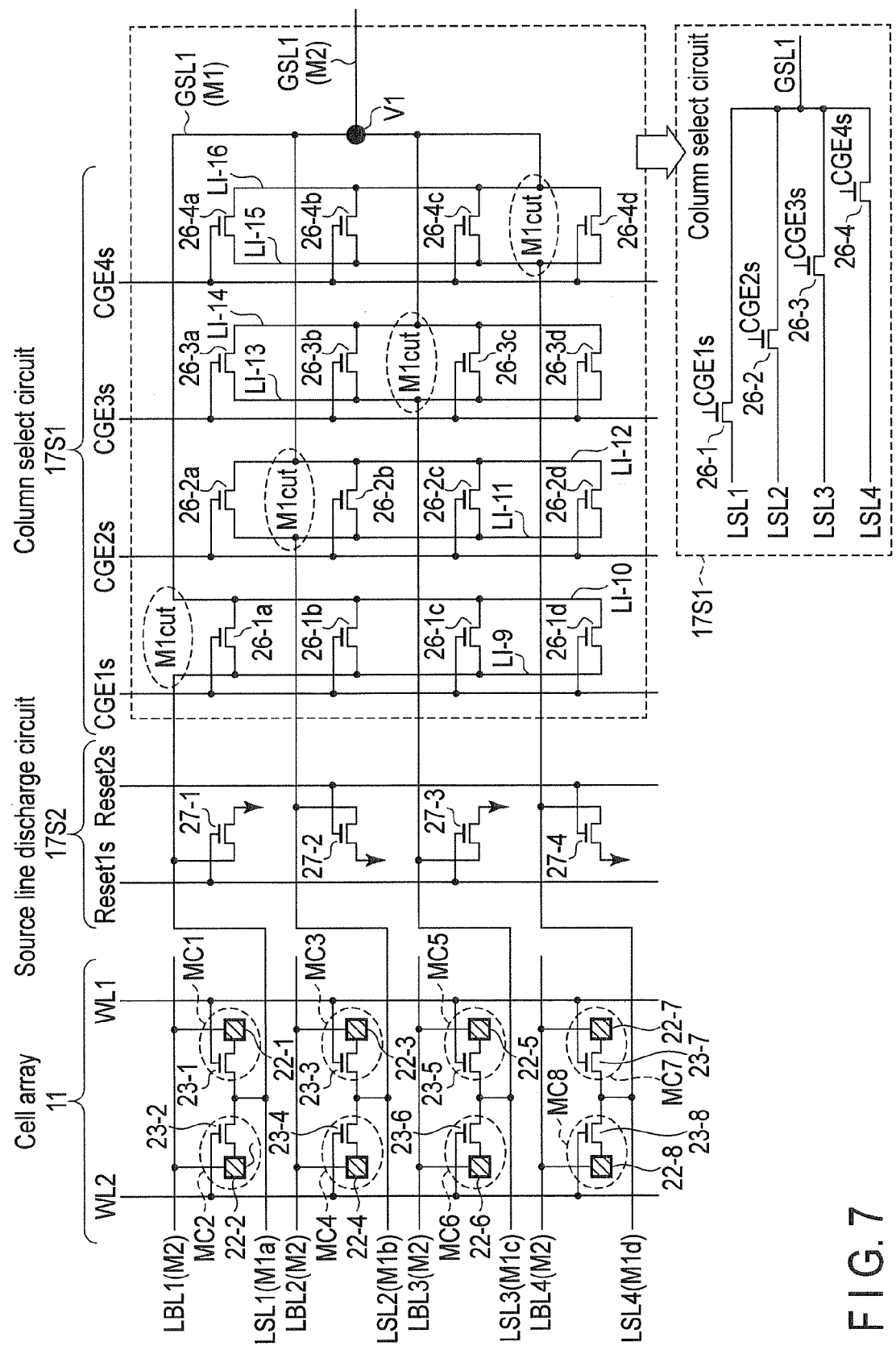
FIG. 7 is a circuit diagram illustrating a relationship between the cell array and a source line controller according to the first embodiment.
Figure 8:
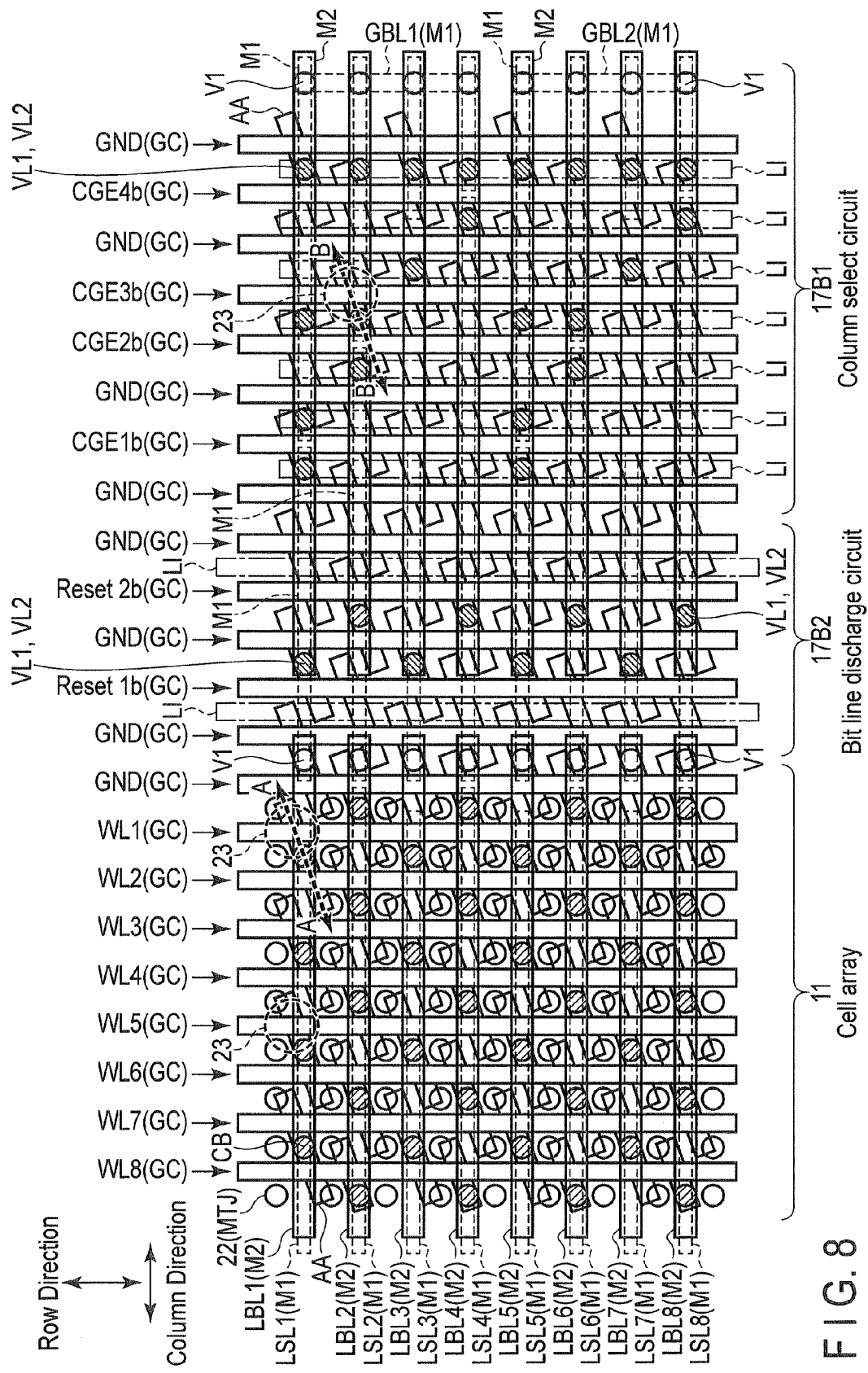
FIG. 8 is a layout illustrating the relationship between the cell array and the bit line controller according to the first embodiment.
Figure 9:
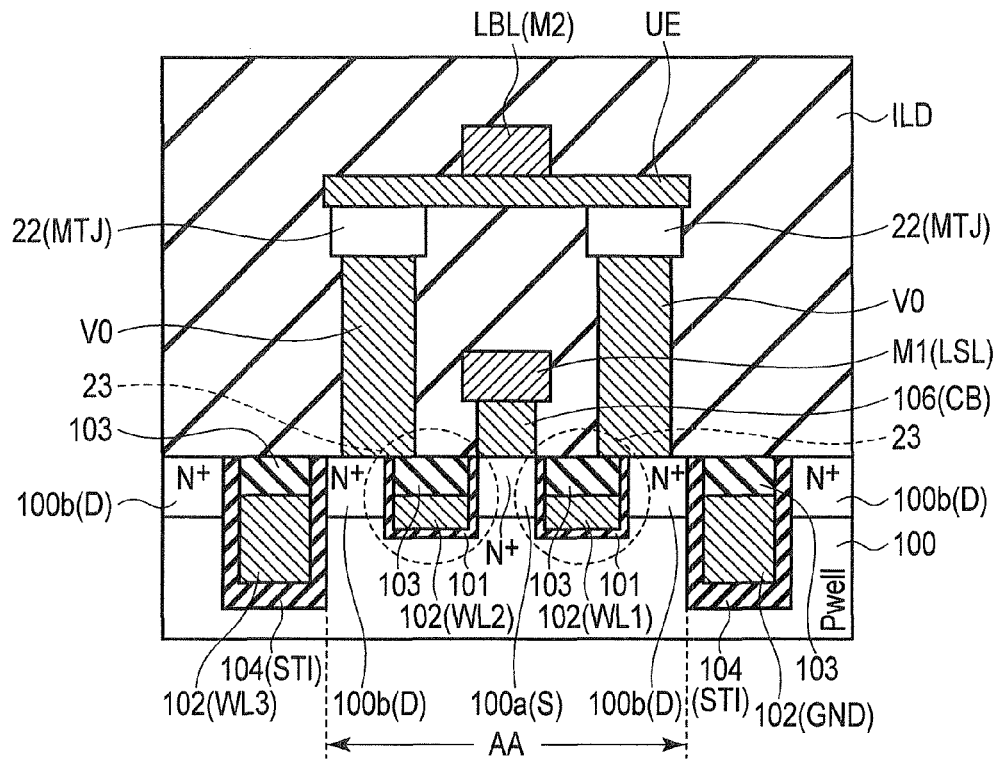
FIG. 9 is a cross-sectional view taken along line A-A in FIG. 8.
Figure 10:
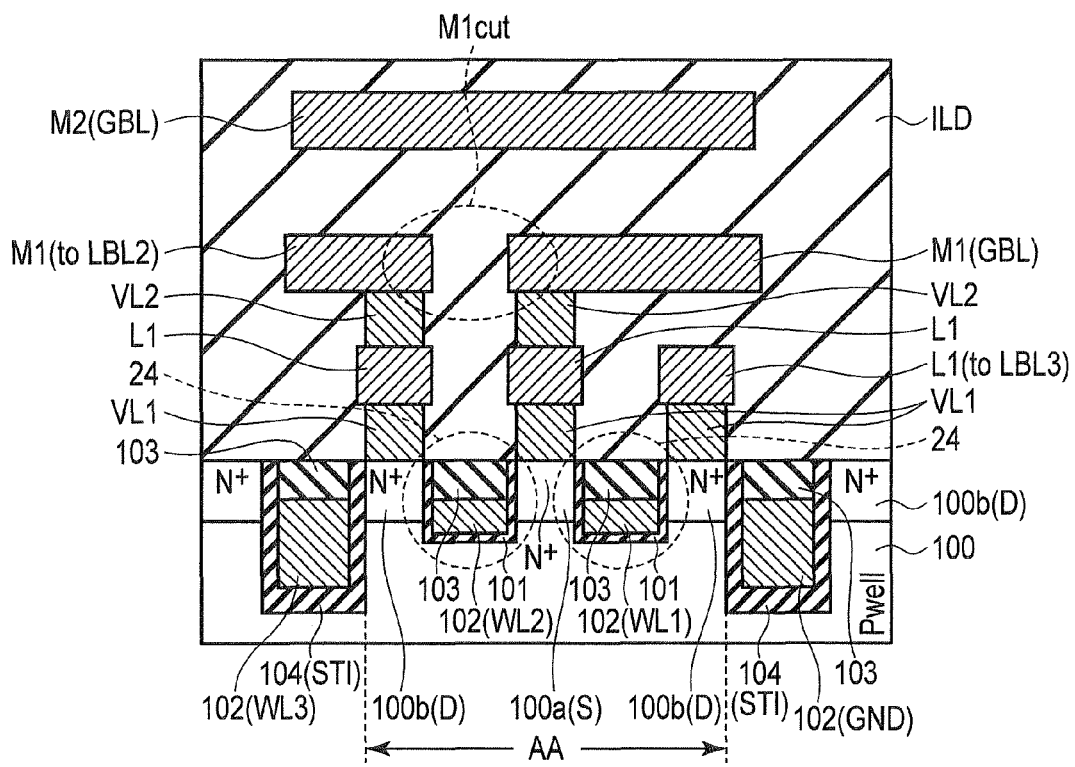
FIG. 10 is a cross-sectional view taken along line B-B in FIG. 8.
Figure 11:
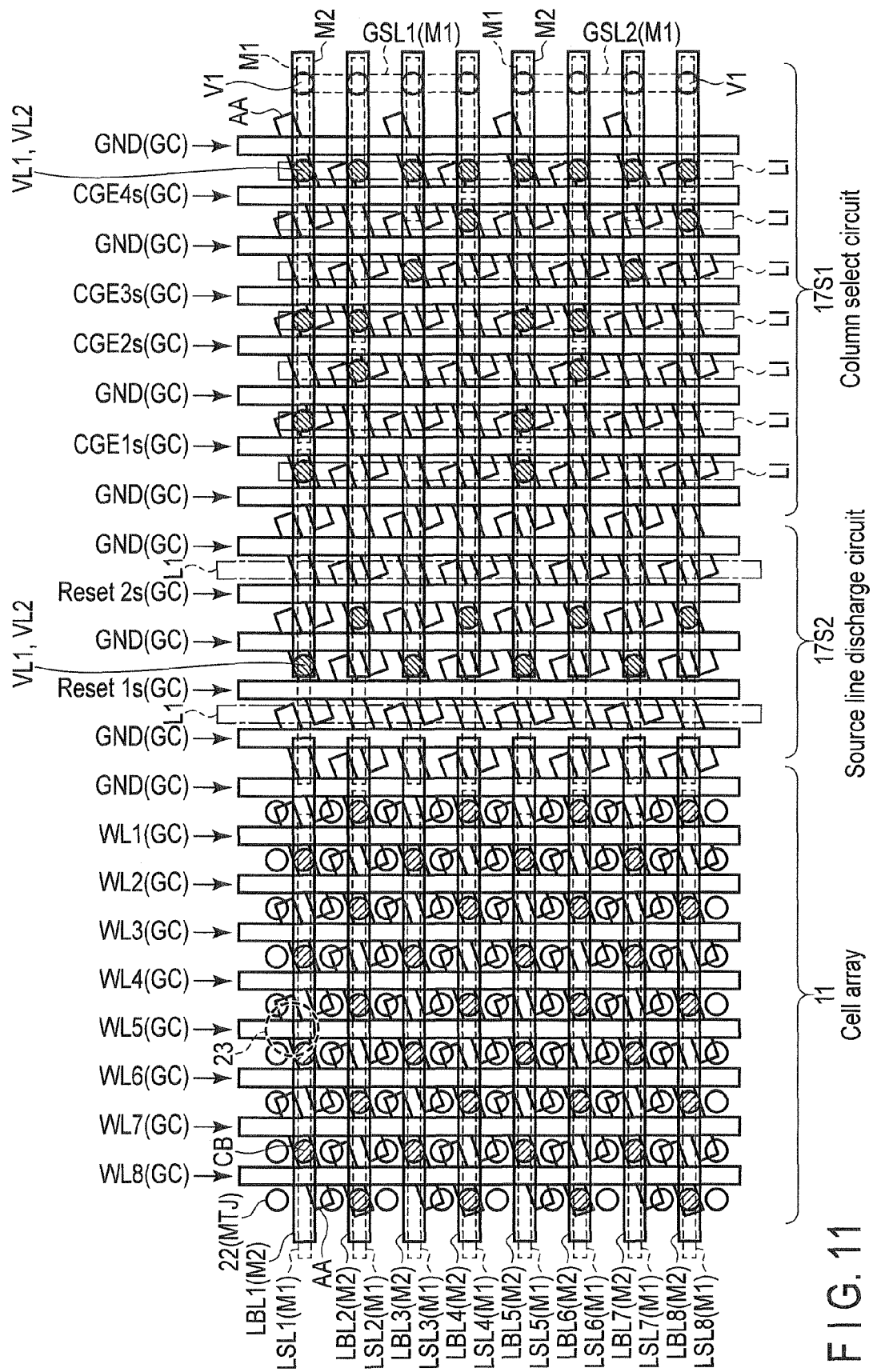
FIG. 11 is a layout illustrating the relationship between the cell array and the source line controller according to the first embodiment.

Next, referring to FIG. 3 to FIG. 11, a layout of cell arrays and peripheral circuits thereof according to the first embodiment is schematically described. FIG. 3 illustrates an example of the layout of cell arrays and peripheral circuits thereof according to the first embodiment. FIG. 4 is a block diagram illustrating a relationship between the cell array and the bit line and source line controller according to the first embodiment. FIG. 5 is a circuit diagram illustrating the relationship between the cell array and the bit line and source line controller according to the first embodiment. FIG. 6 is a circuit diagram illustrating a relationship between the cell array and a bit line controller according to the first embodiment. FIG. 7 is a circuit diagram illustrating a relationship between the cell array and a source line controller according to the first embodiment. FIG. 8 is a layout illustrating the relationship between the cell array and the bit line controller according to the first embodiment. FIG. 9 is a cross-sectional view taken along line A-A in FIG. 8. FIG. 10 is a cross-sectional view taken along line B-B in FIG. 8. FIG. 11 is a layout illustrating the relationship between the cell array and the source line controller according to the first embodiment.

As illustrated in FIG. 3, bit line and source line controllers 17 are provided along both ends along an X direction of each cell array 11. Two bit line and source line controllers 17, which are juxtaposed with each cell array 11, are used for controlling the cell array 11.

In addition, as shown in FIG. 3, word line drivers 20 are provided along both ends along a Y direction of each cell array 11. Two word line drivers 20, which are juxtaposed with each cell array 11, are used for controlling the cell array 11.

The subhole 16 is provided at an intersection between a column in which word line drivers 20 are arranged and a row in which bit line and source line controllers 17 are arranged.

As illustrated in FIG. 4, the bit line and source line controller 17 includes a bit line select circuit CG_BL and a source line select circuit CG_SL.

The bit line select circuit CG_BL includes switch transistors 24-1 to 24-*n* (n is an integer of 1 or more), and selectively connects a global bit line GBL of the sense amplifier/write driver 18 to an n-number of local bit lines LBL1 to LBLn.

In addition, the source line select circuit CG_SL includes switch transistors 26-1 to 26-*n*, and selectively connects a global source line GSL of the sense amplifier/write driver 18 to an n-number of local source lines LSL1 to LSLn.

In the cell array 11, a word line, to which an output of the word line driver 20 is connected and which corresponds to a selected cell, is activated.

The bit line select circuit CG_BL receives an output signal from the subhole 16. In the bit line select circuit CG_BL, based on this output signal, a switch transistor 24-*i* corresponding to a selected local bit line BLi (i is an integer of 1 or more), among an n-number of switch transistors 24-1 to 24-*n*, is turned on. Then, the selected local bit line LBLi is connected to the global bit line GBL, and is connected to the sense amplifier/write driver 18.

Similarly, the source line select circuit CG_SL receives an output signal from the subhole 16. In the source line select circuit CG_SL, based on this output signal, a switch transistor 26-*i* corresponding to a selected local source line LSLi, among an n-number of switch transistors 26-1 to 26-*n*, is turned on. Then, the selected local source line LSLi is connected to the global source line GSL, and is connected to the sense amplifier/write driver 18.

As illustrated in FIG. 5, the bit line select circuit CG_BL includes a column select circuit 17B1 and a bit line discharge circuit 17B2.

The column select circuit 17B1 includes cell transistors 24-1 to 24-*n* functioning as switch transistors 24-1 to 24-*n*. An output signal from the subhole 16 is input to the gate electrode of each of the cell transistors 24-1 to 24-*n*, and the global bit line GBL is connected to one end of a current path of each of the cell transistors 24-1 to 24-*n*. In addition, the current paths of the respective cell transistors 24-1 to 24-*n* are connected to the associated local bit lines LBL1 to LBLn.

The bit line discharge circuit 17B2 includes reset transistors 25 between the cell transistors 24-1 to 24-*n* and the local bit lines LBLn to LBLn. Based on a reset signal from the subhole 16, the bit line discharge circuit 17B2 connects the local bit line to a ground potential. To be more specific, an output signal from the subhole 16 is input to the gate of the reset transistor 25. In addition, any one of the local bit lines LBL1 to LBLn is connected to one end of a current path of the reset transistor 25, and the other end of the current path is connected to a ground potential.

Besides, as illustrated in FIG. 5, the source line select circuit CG_SL includes a column select circuit 17S1 and a source line discharge circuit 17S2.

The column select circuit 17S1 includes cell transistors 26-1 to 26-*n* functioning as switch transistors 26-1 to 26-*n*. An output signal from the subhole 16 is input to the gate electrode of each of the cell transistors 26-1 to 26-*n*, and the global source line GSL is connected to one end of a current path of each of the cell transistors 26-1 to 26-*n*. In addition, the current paths of the respective cell transistors 26-1 to 26-*n* are connected to the associated local source lines LSL1 to LSLn.

The source line discharge circuit 17S2 includes reset transistors 27 between the cell transistors 26-1 to 26-*n* and the local source lines LSL1 to LSLn. Based on a reset signal from the subhole 16, the source line discharge circuit 17S2 connects the local source line to a ground potential. To be more specific, an output signal from the subhole 16 is input to the gate of the reset transistor 27. In addition, any one of the local source lines LSL1 to LSLn is connected to one end of a current path of the reset transistor 27, and the other end of the current path is connected to a ground potential.

Next, referring to FIG. 6, the circuit structure of the column select circuit 17B1 is described in greater detail. In FIG. 6, for the purpose of simple description, only four local bit lines LBL and four local source lines LSL are shown, and only eight memory cells MC in the cell array 11 are shown.

As illustrated in FIG. 6, a memory cell MC1 includes an MTJ element 22-1 which has one end connected to a local bit line LBL1, and a transistor 23-1 which has a current path with one end connected to a local source line LSL1 and the other end connected to the other end of the MTJ element 22-1, and has a gate electrode receiving an input from a word line WL1. In addition, a memory cell MC2 includes an MTJ element 22-2 which has one end connected to the local bit line LBL1, and a transistor 23-2 which has a current path with one end connected to the local source line LSL1 and the other end connected to the other end of the MTJ element 22-2, and has a gate electrode receiving an input from a word line WL2. A memory cell MC3 includes an MTJ element 22-3 which has one end connected to a local bit line LBL2, and a transistor 23-3 which has a current path with one end connected to a local source line LSL2 and the other end connected to the other end of the MTJ element 22-3, and has a gate electrode receiving an input from the word line WL1. A memory cell MC4 includes an MTJ element 22-4 which has one end connected to the local bit line LBL2, and a transistor 23-4 which has a current path with one end connected to the local source line LSL2 and the other end connected to the other end of the MTJ element 22-4, and has a gate electrode receiving an input from the word line WL2. Similarly, memory cells MC5 and MC6 are connected to a local bit line LBL3 and a local source line LSL3, and memory cells MC7 and MC8 are connected to a local bit line LBL4 and a local source line LSL4. In addition, the memory cells MC5 and MC7 are connected to the word line WL1, and the memory cells MC6 and MC8 are connected to the word line WL2. The local bit lines LBL1 to LBL4 are connected wiring lines M1 via via-contacts V1, respectively. Incidentally, as shown in FIG. 6, the local source line LSL is the wiring line M1. However, by a fabrication step called "M1cut" which will be described later, the local source line LSL (see elliptic parts indicated by broken lines in the Figure) is physically cut, so that no short-circuit may occur between the local bit line LBL and local source line LSL by the local bit line LBL being connected to M1 via the via-contact V1.

In addition, as illustrated in FIG. 6, the bit line discharge circuit 17B2 includes, for example, reset transistors 25-1 to 25-4. The reset transistor 25-1 has a current path with one end connected to M1*a* and the other end connected to a ground potential, and has a gate electrode to which a reset signal RESET1*b* is input. The reset transistor 25-2 has a current path with one end connected to M1*b* and the other end connected to a ground potential, and has a gate electrode to which a reset signal RESET2*b* is input. The reset transistor 25-3 has a current path with one end connected to M1*c* and the other end connected to a ground potential, and has a gate electrode to which the reset signal RESET1*b* is input. The reset transistor 25-4 has a current path with one end connected to M1*d* and the other end connected to a ground potential, and has a gate electrode to which the reset signal RESET2*b* is input.

Besides, as illustrated in FIG. 6, the column select circuit 17B1 includes switch transistors 24-1 to 24-4. The switch transistor 24-1 includes switch transistors 24-1*a*, 24-1*b*, 24-1*c* and 24-1*d*, each of which has a current path with one end connected to the wiring line M1*a* via a wiring line LI-1 and the other end connected to a global bit line GBL1 (M1) via a wiring line LI-2, and has a gate electrode to which a control signal CGE1*b* is input.

In addition, the switch transistor 24-2 includes switch transistors 24-2*a*, 24-2*b*, 24-2*c* and 24-2*d*, each of which has a current path with one end connected to the wiring line M1*b* via a wiring line LI-3 and the other end connected to the global bit line GBL1 (M1) via a wiring line LI-4, and has a gate electrode to which a control signal CGE2*b* is input.

The switch transistor 24-3 includes switch transistors 24-3*a*, 24-3*b*, 24-3*c* and 24-3*d*, each of which has a current path with one end connected to the wiring line M1*c* via a wiring line LI-5 and the other end connected to the global bit line GBL1 (M1) via a wiring line LI-6, and has a gate electrode to which a control signal CGE3*b* is input.

The switch transistor 24-4 includes switch transistors 24-4*a*, 24-4*b*, 24-4*c* and 24-4*d*, each of which has a current path with one end connected to the wiring line M1*d* via a wiring line LI-7 and the other end connected to the global bit line GBL1 (M1) via a wiring line LI-8, and has a gate electrode to which a control signal CGE4*b* is input.

In the meantime, the wiring line M1*a* and global bit line GBL1 (M1) are physically cut by the above-described M1cut step. Similarly, the wiring lines M1*b*, M1*c* and M1*d* and the global bit line GBL1 (M1) are physically cut by the above-described M1cut step.

In addition, the global bit line GBL1 (M1) is connected to a global bit line GBL1 (M2) via a via-contact V1.

In FIG. 6, in each of the switch transistors 24-1 to 24-4, four transistors are operated as one transistor. Alternatively, in each of the switch transistors 24-1 to 24-4, more than four transistors, for instance, 8 transistors or 16 transistors, may be operated as one transistor.

The wiring lines designated by "M1" are formed by the same fabrication step, the wiring lines designated by "M2" are formed by the same fabrication step, and the wiring lines designated by "LI" are formed by the same fabrication step. In addition, the plugs designated by "V1" are formed by the same fabrication step. Besides, the transistors 23 of the cell array 11, the transistors 25, and the switch transistors 24-1*a*, 24-1*b*, 24-1*c*, 24-1*d*, 24-2*a*, 24-2*b*, 24-2*c*, 24-2*d*, 24-3*a*, 24-3*b*, 24-3*c*, 24-3*d*, 24-4*a*, 24-4*b*, 24-4*c*, and 24-4*d* are cell transistors of the same size.

Next, referring to FIG. 7, the circuit structure of the column select circuit 17S1 is described in greater detail. In FIG. 7, like FIG. 6, for the purpose of simple description, only four local bit lines LBL and four local source lines LSL are shown, and only eight memory cells MC in the cell array 11 are shown. Since the structure of the cell array 11 is the same as that described with reference to FIG. 6, a description thereof is omitted here.

As illustrated in FIG. 7, the source line discharge circuit 17S2 includes, for example, reset transistors 27-1 to 27-4. The reset transistor 27-1 has a current path with one end connected to M1*a* and the other end connected to a ground potential, and has a gate electrode to which a reset signal RESET1s is input. The reset transistor 27-2 has a current path with one end connected to M1b and the other end connected to a ground potential, and has a gate electrode to which a reset signal RESET2s is input. The reset transistor 27-3 has a current path with one end connected to M1c and the other end connected to a ground potential, and has a gate electrode to which the reset signal RESET1s is input. The reset transistor 27-4 has a current path with one end connected to M1d and the other end connected to a ground potential, and has a gate electrode to which the reset signal RESET2s is input.

Besides, as illustrated in FIG. 7, the column select circuit 17S1 includes switch transistors 26-1 to 26-4. The switch transistor 26-1 includes switch transistors (cell transistors) 26-1a, 26-1b, 26-1c and 26-1d, each of which has a current path with one end connected to the wiring line Mia via a wiring line LI-9 and the other end connected to a global source line GSL1 (M1) via a wiring line LI-10, and has a gate electrode to which a control signal CGE1s is input.

In addition, the switch transistor 26-2 includes switch transistors (cell transistors) 26-2a, 26-2b, 26-2c and 26-2d, each of which has a current path with one end connected to the wiring line M1b via a wiring line LI-11 and the other end connected to the global source line GSL1 (M1) via a wiring line LI-12, and has a gate electrode to which a control signal CGE2s is input.

The switch transistor 26-3 includes switch transistors (cell transistors) 26-3a, 26-3b, 26-3c and 26-3d, each of which has a current path with one end connected to the wiring line M1c via a wiring line LI-13 and the other end connected to the global source line GSL1 (M1) via a wiring line LI-14, and has a gate electrode to which a control signal CGE3s is input.

The switch transistor 26-4 includes switch transistors (cell transistors) 26-4a, 26-4b, 26-4c and 26-4d, each of which has a current path with one end connected to the wiring line M1d via a wiring line LI-15 and the other end connected to the global source line GSL1 (M1) via a wiring line LI-16, and has a gate electrode to which a control signal CGE4s is input.

In the meantime, the wiring line Mia and global source line GSL1 (M1) are physically cut by the above-described M1cut step. Similarly, the wiring lines M1b, M1c and M1d and the global source line GSL1 (M1) are physically cut by the above-described M1cut step.

In addition, the global source line GSL1 (M1) is connected to a global source line GSL1 (M2) via a via-contact V1.

In FIG. 7, in each of the switch transistors 26-1 to 26-4, four transistors are operated as one transistor. Alternatively, in each of the switch transistors 24-1 to 24-4, more than four transistors, for instance, 8 transistors or 16 transistors, may be operated as one transistor.

The wiring lines designated by "M1" are formed by the same fabrication step, the wiring lines designated by "M2" are formed by the same fabrication step, and the wiring lines designated by "LI" are formed by the same fabrication step. In addition, the plugs designated by "V1" are formed by the same fabrication step. Besides, the transistors 23 of the cell array 11, the reset transistors (cell transistors) 27, and the switch transistors (cell transistors) 26-1a, 26-1b, 26-1c, 26-1d, 26-2a, 26-2b, 26-2c, 26-2d, 26-3a, 26-3b, 26-3c, 26-3d, 26-4a, 26-4b, 26-4c, and 26-4d are cell transistors of the same size.

Next, referring to FIG. 8 to FIG. 10, the layout of the column select circuit 17B1 is described. In FIG. 8, for the purpose of simple description, only eight local bit lines LBL and eight local source lines LSL are shown, and only eight word lines WL in the cell array 11 are shown. In addition, in FIG. 8 to FIG. 10, the direction of extension of word lines WL (gate electrodes GC) is set to be a row direction (first direction), and a direction substantially perpendicular to the row direction is set to be a column direction (second direction). The bit lines BL and source lines SL extend in the column direction.

As illustrated in FIG. 8 to FIG. 10, in the cell array 11, column select circuit 17B1 and bit line discharge circuit 17B2, cell transistors 23, 24, 25 are provided at intersections between gate electrodes GC and active areas AA. Two cell transistors 23, 24, 25 are provided in association with one active area AA.

As illustrated in FIG. 8, the active areas AA of the cell array 11, bit line discharge circuit 17B2 and column select circuit 17B1 in the first embodiment extend in a direction crossing the gate electrodes GC at a predetermined angle. Specifically, the active areas AA are inclined at a predetermined angle to the row direction. For example, the active area AA in the first embodiment extends in a direction crossing the gate electrode GC at an angle of (90−a tan(1/3)). Specifically, the active area AA is inclined at an angle of about 71.565° to the row direction.

The configuration of the memory cell array 11 is disclosed in U.S. patent application Ser. No. 13/420,106 filed Mar. 14, 2012 and entitled "SEMICONDUCTOR STORAGE DEVICE". The entire descriptions of these patent applications are incorporated by reference herein.

In addition, in the first embodiment, the width of the gate electrode GC (word line WL) in the column direction, or the distance between neighboring gate electrodes GC (word lines WL), is 3/2 times or 2/3 times as large as the width of the active area AA in the row direction, or the distance between neighboring active areas AA.

For example, the width of the gate electrode GC in the column direction, or the distance between neighboring gate electrodes GC, is about 34.8 nm. The width of the active area AA or the distance between neighboring active areas AA is about 21.923 nm. The active area AA is inclined at an angle of a tan(1/3) degree (about 18.435°) to the column direction. Accordingly, the width of the active area AA in the row direction or the distance between neighboring active areas AA is about 23.2 nm. Thus, in this case, the width of the gate electrode GC in the column direction, or the distance between neighboring gate electrodes GC, is 3/2 times as large as the width of the active area AA in the row direction or the distance between neighboring active areas AA.

Since the pitch of the bit line BL and source line SL is in accordance with 1.5 times as large as the pitch of the active area AA, the ratio between the pitch of the bit line BL and source line SL (column) and the pitch of the word lines WL (row) is 1:1. On the other hand, the ratio between the line & space of the active area AA and the line & space of the gate electrode GC (word line WL) is 2:3.

In this manner, by inclining, for example, the active area AA at an angle of (90−a tan(1/3)) from the row direction, and by setting the ratio in pitch between the active area AA and gate electrode GC (word line WL) at 2:3, the MTJ elements 22 may be arranged at equal intervals (equal pitch) in the column direction and row direction. In the above-described concrete example, the interval between the MTJ elements 22 neighboring in the column direction and row direction is about 69.6 nm.

As illustrated in FIG. 8 and FIG. 9, in the cell array 11, the MTJ element 22 is provided on a via-contact V0, at a position between an upper electrode UE and the via contact V0. Two MTJ elements 22 are formed at both ends of the active area AA, and are connected to a common source region 100a(S) via associated cell transistors 23. One MTJ element 22 and one cell transistor 23 constitute a memory cell MC. Specifically, the active areas AA are isolated in the direction of extension thereof in units of two cell transistors 23 (memory cells MC), and two memory cells MC are provided in each active area AA.

As shown in FIG. 8 and FIG. 9, in the cell array 11, active areas AA and device isolation regions (Shallow Trench Isolation; STI) 104 are alternately formed on a semiconductor substrate 100. Cell transistors 23 are formed in the active area AA. The cell transistor 23 includes a gate electrode 102 (word line WL) which is buried in the semiconductor substrate 100, and includes a source region 100a(S) and a drain region 100b(D) of an N+ type on both sides of the gate electrode 102. In the meantime, the gate electrode 102 is insulatively isolated from the semiconductor substrate 100 by an insulation layer 101. In addition, the gate electrode 102 is insulatively isolated from the wiring line M1, M2 by an insulation layer 103.

Two cell transistors 23 are formed in the same active area AA, and these two cell transistors 23 share the source region 100a(S) or drain region 100b(D). It is assumed that the two cell transistors 23 share the source region 100a(S).

The common source region 100a(S) of the cell transistor 23 is electrically connected to a first wiring line M1 which is formed of a first metal wiring layer, via a contact plug 106(CB). The first wiring line M1 functions as a local source line LSL.

The drain region 100b(D) of the cell transistor 23 is electrically connected to a lower end (e.g. a pin layer) of the MTJ element 22 via the via-contact V0.

An upper end (e.g. a free layer) of the MTJ element 22 is connected to the upper electrode UE. In the row direction, the upper ends of two mutually neighboring MTJ elements 22 are connected to the common upper electrode UE, and the upper electrode UE is connected to a second wiring line M2 which is formed of a second metal wiring layer. The second wiring line M2 functions as a local bit line LBL. An interlayer insulation film (Inter-Layer Dielectric) ILD is provided for insulation between wiring lines.

In a data write or data read operation, in order to select a certain memory cell MC, a gate electrode GC (word line WL) corresponding to this memory cell MC is driven. Thereby, a plurality of cell transistors, which are connected to the word line WL and are arranged in the row direction, are rendered conductive. Then, by applying a voltage between the bit line BL1 and source line SL1 of a certain column, a memory cell MC corresponding to an intersection between the selected word line WL and the selected bit line BL1 and source line SL1 is selected, and an electric current can be caused to flow to the MTJ element of the selected memory cell MC via the cell transistor.

As illustrated in FIG. 8 and FIG. 10, in the column select circuit 17B1, active areas AA and device isolation regions (Shallow Trench Isolation: STI) 104 are alternately formed on the semiconductor substrate 100. Cell transistors 24 are formed in the active area AA. The cell transistor 24 includes a gate electrode 102 (word line WL) which is buried in the semiconductor substrate 100, and includes a source region 100a(S) and a drain region 100b(D) of an N+ type on both sides of the gate electrode 102. In the meantime, the gate electrode 102 is insulatively isolated from the semiconductor substrate 100 by an insulation layer 101. In addition, the gate electrode 102 is insulatively isolated from the wiring line M1, M2 by an insulation layer 103.

Two cell transistors 24 are formed in the same active area AA, and these two cell transistors 24 share the source region 100a(S) or drain region 100b(D). It is assumed that the two cell transistors 24 share the source region 100a(S).

The common source region 100a(S) of the cell transistor 24 is electrically connected to a wiring line LI via a via-contact VL1. In addition, the wiring line LI is electrically connected via a via-contact VL2, which is provided on the wiring line LI, to a first wiring line M1 which is formed of a first metal wiring layer and functions as a global bit line GBL.

The drain region 100b(D) of the cell transistor 24 including a gate electrode CGE2 is electrically connected to a wiring line LI via a via-contact VL1. In addition, the wiring line LI is electrically connected to a first wiring line M1 which is formed of a first metal wiring layer, via a via-contact VL2 provided on the wiring line LI. This wiring line M1 is electrically connected to the local bit line LBL2 via a via-contact V1 which is provided between the cell array 11 and the bit line discharge circuit 17B2.

The drain region 100b(D) of the cell transistor 24 including a gate electrode CGE3 is electrically connected to a wiring line LI via a via-contact VL1. In addition, the wiring line LI is electrically connected to a first wiring line M1 (not shown) which is formed of a first metal wiring layer, via a via-contact VL2 (not shown) provided on the wiring line LI. This wiring line M1 is electrically connected to the local bit line LBL3 via a via-contact V1 which is provided between the cell array 11 and the bit line discharge circuit 17B2. An interlayer insulation film (Inter-Layer Dielectric) ILD is provided for insulation between wiring lines. Further, a wiring line M2 is provided above the wiring line M1, via the ILD. This wiring line M2 functions as a global bit line GBL, and is electrically connected to the wiring line M1 (GBL) via the via-contact V1.

In the bit line discharge circuit 17B2, the cell transistor 25 has the same structure as the cell transistor 23, 24. As described above, the cell transistors 23, 24 and 25 have the same structure and size.

Next, referring to FIG. 11, the layout of the column select circuit 17S1 and source line discharge circuit 17S2 is schematically described. In FIG. 11, for the purpose of simple description, only eight local bit lines LBL and eight local source lines LSL are shown, and only eight word lines WL in the cell array 11 are shown.

As illustrated in FIG. 11, the structures of the column select circuit 17S1 and source line discharge circuit 17S2 are the same as the structures of the column select circuit 17B1 and bit line discharge circuit 17B2 described with reference to FIG. 8. Thus, the cell transistor 23 of the cell array 11, the transistor 26 of the column select circuit 17B1 and the transistor 27 of the bit line discharge circuit 17B2 have the same structure and size.

As has been described above, in the column select circuit 17B1, 17S1, bit line discharge circuit 17B2 and source line discharge circuit 17S2 in the first embodiment, the transistors 24 to 27 can be disposed with the pitch of the word line WL in the cell array 11. However, device isolation is necessary between transistors neighboring in the column direction, and one gate electrode needs to be set at a ground potential (GND) with respect to three gate electrodes. In FIG. 6 and FIG. 7, for the purpose of simple description, the gate electrode (GND) is not shown.

<Manufacturing Method of the Semiconductor Storage Device According to the First Embodiment>

Next, referring to FIG. 12, a basic manufacturing method of the semiconductor storage device according to the first embodiment is schematically described. FIG. 12 is a flowchart which schematically illustrates the basic manufacturing method of the semiconductor storage device according to the first embodiment.

FIG. 12 illustrates, in a simultaneous manner, a manufacturing process of the cell array 11 and a manufacturing process of the column select circuit 17B1, 17S1, bit line discharge circuit 17B2 and source line discharge circuit 17S2. For the purpose of simple description, the column select circuit 17B1, 17S1 is simply referred to as "column select circuit", and the bit line discharge circuit 17B2 and source line discharge circuit 17S2 are simply referred to as "discharge circuit".

[Step S1001] (Target Areas: Cell Array, Column Select Circuit, and Discharge Circuit)

A hard mask (not shown) is formed on the semiconductor substrate 100. A resist (not shown) with a stripe shape of a line & space (L/S) pattern is formed on the hard mask. Then, using the resist as a mask, the hard mask is processed, and the L/S pattern is transferred onto the surface of the semiconductor substrate 100 by using the processed hard mask. Subsequently, a process film (not shown) or a resist (not shown) is coated on the semiconductor substrate 100.

[Step S1002] (Target Areas: Cell Array, Column Select Circuit, and Discharge Circuit)

A staggered pattern is formed on the resist, so as to cut the L/S pattern, which has been transferred on the semiconductor substrate 100, at predetermined intervals. Using the resist and the process film, the L/S pattern, which has been transferred on the semiconductor substrate 100, is cut (AAcut) at predetermined intervals. Then, an insulation film is buried in recesses in the semiconductor substrate 100. Thereby, the cut area becomes a shallow trench isolation STI. In the description below, for the purpose of simple description, a projection formed on the semiconductor substrate 100 is referred to as an active area AA.

[Step S1003] (Target Areas: Cell Array, Column Select Circuit, and Discharge Circuit)

A hard mask (not shown) is formed on the semiconductor substrate 100. A resist (not shown) with a stripe shape of an L/S pattern is formed on the hard mask. This L/S pattern extends in a direction crossing the active area AA at a predetermined angle. Then, using the resist as a mask, the hard mask is processed, and the L/S pattern is transferred onto the surface of the semiconductor substrate 100 by using the processed hard mask. Subsequently, insulation films 101, 103, 104 and gate electrodes 102 are formed in the L/S pattern.

[Step S1004] (Target Areas: Column Select Circuit, and Discharge Circuit)

Following the above, in the column select circuit and discharge circuit, via-contacts VL1 are formed on source and drain regions of the active area AA.

[Step S1005] (Target Areas: Column Select Circuit, and Discharge Circuit)

Subsequently, in the column select circuit and discharge circuit, wiring lines LI are formed on the via-contacts VL1. By the wiring lines LI, plural cell transistors are electrically connected in parallel.

[Step S1006] (Target Areas: Column Select Circuit, and Discharge Circuit)

Then, in the column select circuit and discharge circuit, via-contacts VL2 are formed on the wiring lines LI.

[Step S1007] (Target Area: Cell Array)

Subsequently, in the cell array 11, a contact plug CB is formed on the source region 100a(S) of the semiconductor substrate 100.

[Step S1008] (Target Areas: Cell Array, Column Select Circuit, and Discharge Circuit)

Then, wiring lines M1 are formed on the via-contacts VL2 and contact plug CB.

[Step S1009] (Target Areas: Column Select Circuit, and Discharge Circuit)

Subsequently, those portions of the wiring lines M1, which need to be physically cut, in the column select circuit and discharge circuit, are cut (M1cut).

[Step S1010] (Target Area: Cell Array)

Then, in the cell array, via-contacts V0 are formed on the drain regions 100b(D) of the semiconductor substrate 100.

[Step S1011] (Target Area: Cell Array)

Subsequently, in the cell array, MTJ elements 22 are formed on the via-contacts V0.

[Step S1012] (Target Area: Cell Array)

Then, in the cell array, an upper electrode UE, which connects two MTJ elements 22 is formed.

[Step S1013] (Target Areas: Column Select Circuit, and Discharge Circuit)

Next, in the column select circuit and discharge circuit, via-contacts V1 are formed on the wiring lines M1.

[Step S1014] (Target Areas: Cell Array, Column Select Circuit, and Discharge Circuit)

Subsequently, wiring lines M2 are formed on the via-contacts V1.

As has been described above, the manufacturing processes of the cell array, column select circuit and discharge circuit are performed in a simultaneous manner in Steps S1001, S1002, S1003, S1008 and S1014.

<Advantageous Effects of the Semiconductor Storage Device According to the First Embodiment>

According to the above-described first embodiment, the active areas AA in the cell array 11, column select circuit 17B1, 17S1, bit line discharge circuit 17B2 and source line discharge circuit 17S2 cross the gate electrodes GC at a predetermined angle. In addition, the cell transistors in the cell array 11, column select circuit 17B1, 17S1, bit line discharge circuit 17B2 and source line discharge circuit 17S2 have substantially the same structure and size.

In this manner, the column select circuit 17B1, 17S1, bit line discharge circuit 17B2 and source line discharge circuit 17S2 can be reduced in size by being laid out by using the cell rule of the cell array 11.

In addition, when use is made of the process in which the active areas AA and gate electrodes GC cross at a specific angle, the variance among memory cells can be suppressed and the manufacturing yield can be improved.

Besides, since the same process can be used in the cell array 11, column select circuit 17B1, 17S1, bit line discharge circuit 17B2 and source line discharge circuit 17S2, no load is added to manufacturing processes.

Second Embodiment

Next, a semiconductor storage device according to a second embodiment is described. In the second embodiment, an additional description is given of the structure of the subhole. In the second embodiment, the structural elements having substantially the same functions and structures as in the above-described first embodiment are denoted by like reference signs, and an overlapping description is given only where necessary.

<Structure of a Semiconductor Storage Device According to a Second Embodiment>

Figure 13:
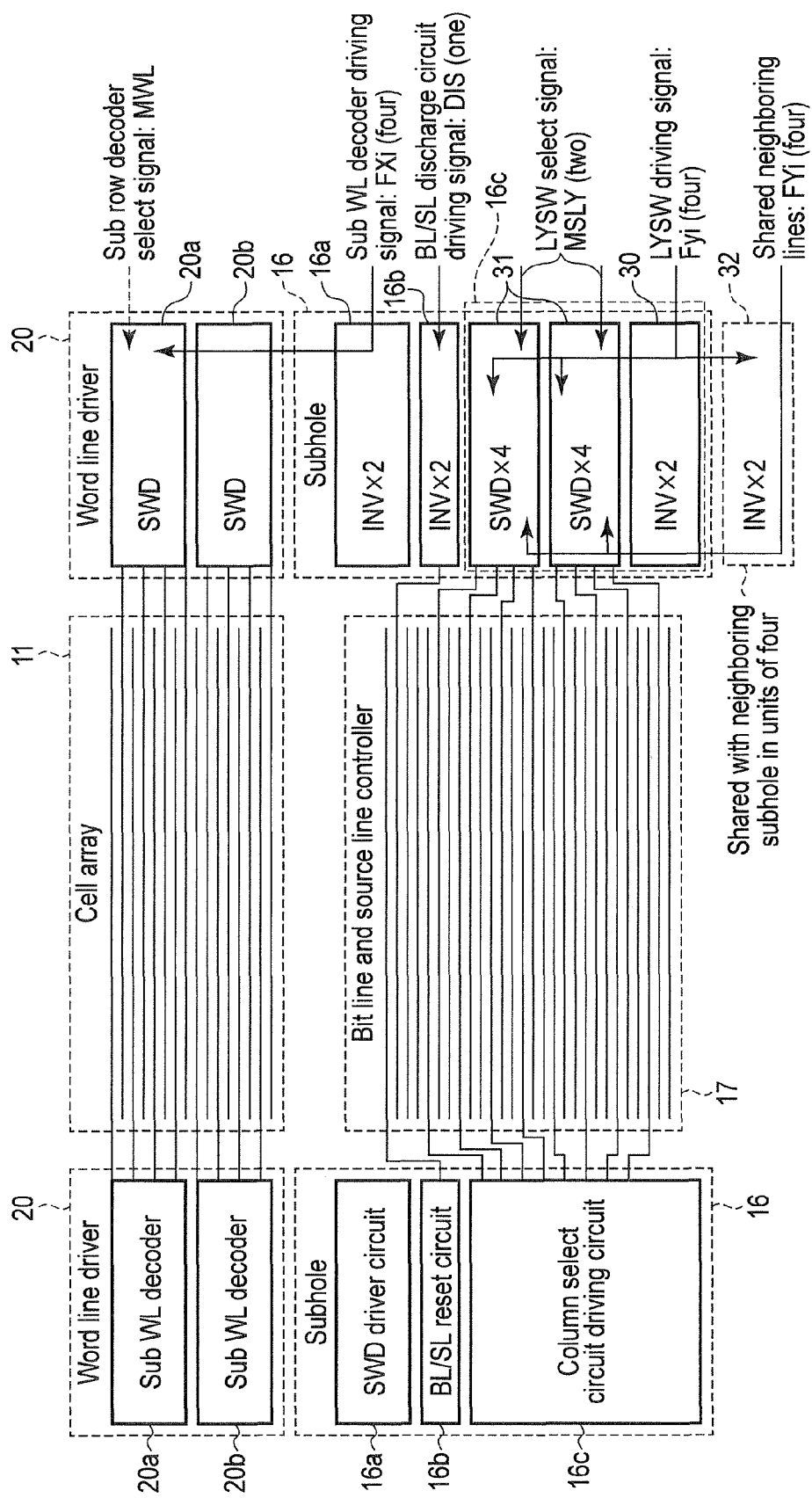
FIG. 13 is a block diagram which schematically illustrates a structure of a subhole.

Referring to FIG. 13 and FIG. 14A, FIG. 14B, FIG. 14C and FIG. 14D, the semiconductor storage device according to the second embodiment is described. FIG. 13 is a block diagram which schematically illustrates the structure of the subhole, FIG. 14A is a circuit diagram illustrating an inverter of a column select circuit driver, FIG. 14B is a circuit diagram illustrating an SWD driver of the column select circuit driver, FIG. 14C is a circuit diagram of the SWD driver, and FIG. 14D is a circuit diagram of a BL/SL reset driver.

As illustrated in FIG. 13, the subhole 16 includes an SWD driver 16a, a BL/SL reset driver 16b, and a column select circuit driver 16c. In addition, the word line driver 20 includes SWD (sub-word line decoder) drivers 20a and 20b.

In addition, as illustrated in FIG. 13, FIG. 14A and FIG. 14B, the column select circuit driver 16c includes an inverter 30 and an SWD driver 31. The inverter 30 includes a PMOSFET 30a having a current path with one end supplied with VPP and the other end connected to a node N1, and having a gate to which a driving signal FYB is input; and an NMOSFET 30b having a current path with one end connected to the node N1 and the other end connected to a ground potential, and having a gate to which the driving signal FYB is input. A signal FY is output from the node N1. The column select circuit driver 16c includes, for example, two such inverters 30.

The SWD driver 31 includes a PMOSFET 31 having a current path with one end to which the FY is input, and the other end connected to a node N2, and having a gate to which a select signal MLYB is input; an NMOSFET 31b having a current path with one end connected to the node N2 and the other end connected to a ground potential, and having a gate to which the select signal MLYB is input; and an NMOSFET 31c having a current path with one end connected to the node N2 and the other end connected to a ground potential, and having a gate to which the driving signal FYB is input. A signal SLY is output from the node N2. The column select circuit driver 16c includes, for example, eight such SWD drivers 31.

In addition, as illustrated in FIG. 13 and FIG. 14C, the SWD driver 16a includes a PMOSFET 32a having a current path with one end supplied with VPP and the other end connected to a node N3, and having a gate to which a driving signal FXB is input; and an NMOSFET 32b having a current path with one end connected to the node N3 and the other end connected to a ground potential, and having a gate to which the driving signal FXB is input. A signal FX is output from the node N3.

Furthermore, as illustrated in FIG. 13 and FIG. 14D, the BL/SL reset driver 16b includes a PMOSFET 33a having a current path with one end supplied with VPP and the other end connected to a node N4, and having a gate to which a driving signal DIS is input; and an NMOSFET 33b having a current path with one end connected to the node N4 and the other end connected to a ground potential, and having a gate to which the driving signal DIS is input. A signal DISB is output from the node N4.

Besides, as illustrated in FIG. 13, an inverter 32 is provided in a region neighboring the subhole 16. The inverter 32 supplies signals FY (four signals) to the SWD driver 31 of the neighboring subhole 16.

<Advantageous Effects of the Semiconductor Storage Device According to the Second Embodiment>

As illustrated in the above-described FIG. 13, the structures of the SWD drivers 20a and 20b and SWD driver 31 are the same.

In addition, the signals, which are input to the respective circuits in the subhole 16, are input via wiring lines M3 which are formed above the wiring lines M2.

By using the subhole 16 with the above-described structure, as shown in FIG. 13, the length of the bit line and source line controller 17 and the length of the subhole 16 can be made substantially equal in the direction of the bit line BL and source line SL.

Specifically, by laying out the SWD driver 31 of the subhole 16 in accordance with the SWD drivers 20a and 20b, the subhole 16 can be laid out without a useless space at an intersection part between the SWD drivers 20a and 20b and the bit line and source line controller 17.

In the meantime, in the above-described first embodiment, the active areas AA are cut at predetermined intervals. However, the active areas AA may not be cut.

In addition, in the above-described first embodiment, the active areas AA are inclined at an angle of about 71.565° to the row direction, but the embodiment is not limited to this example. For example, the active areas AA may be configured to extend in a direction crossing the gate electrodes GC at an angle of (90−a tan(1/2)). Alternatively, the active areas AA may be configured to extend in a direction crossing the gate electrodes GC at 45°.

In each of the above-described embodiments, the MRAM has been described as the storage device by way of example. However, the embodiments can also be implemented as other resistance change type memories including the same elements as illustrated in the first and second embodiment, for example, as an element used in a PRAM or PCRAM (phase change random access memory), or a ReRAM (resistive random access memory).

Besides, in each of the above-described embodiments, the bit line pair has been referred to as the bit line BL and source line SL, for convenience's sake. However, the embodiment is not limited to this example, and the bit line pair may be referred to, for example, as a first bit line and a second bit line.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor storage device comprising:
   a first area including a plurality of memory cells;
   a second area that is adjacent to the first area in a first direction and does not include a plurality of memory cells;
   a plurality of first bit lines electrically connected to first ends of the memory cells and extending in the first direction in the first and second areas;
   a plurality of first source lines electrically connected to second ends of the memory cells and extending in the first direction in the first and second areas;
   a plurality of second bit lines extending in the first direction in the second area, wherein the second bit lines are extensions of the first bit lines;

a plurality of second source lines extending in the first direction in the second area, wherein the second source lines are extension of the first source lines;

a plurality of first switch transistors which connect the first bit lines and the second bit lines; and a plurality of second switch transistors which connect the first source lines and the second source lines, wherein with respect to each of the memory cells:
the memory cell includes a resistance change element and a first cell transistor,
the first cell transistor includes a first gate electrode extending in a second direction,
a first end of the resistance change element is electrically connected to a first end of the first cell transistor,
one of the first bit lines is electrically connected to a second end of the resistance change element, and
one of the first source lines is electrically connected to a second end of the first cell transistor, wherein the first and second switch transistors comprise a plurality of second cell transistors each including:
a first end electrically connected to one of the first bit lines or one of the first source lines,
a second end electrically connected to one of the second bit lines or one of the second source lines, and
a second gate electrode extending in the second direction, wherein the first area includes a plurality of first active areas in which a plurality of first cell transistors, each of which is the first cell transistor of one of the memory cells, are formed and which extend in a direction crossing the first direction at a first angle, and wherein the second area includes a plurality of second active areas in which the second cell transistors are formed and which extend in a direction crossing the first direction at a second angle.

2. The semiconductor storage device of claim 1, further comprising a discharge circuit including:
a plurality of third cell transistors each including a first end electrically connected to one of the first bit lines or one of the first source lines, a second end electrically connected to a ground potential, and a third gate electrode extending in the second direction; and
a plurality of third active areas in which the third cell transistors are formed and which extend in a direction crossing the first direction at a third angle.

3. The semiconductor storage device of claim 2, wherein the first cell transistors, the second cell transistors, and the third cell transistors are substantially the same size.

4. The semiconductor storage device of claim 2, wherein the first angle, the second angle, and the third angle are equal.

5. The semiconductor storage device of claim 1, wherein a predetermined number of the second cell transistors include the first ends which are electrically connected in parallel, and include the second gate electrodes to which the same signal is input.

6. The semiconductor storage device of claim 1, wherein the second area includes a first controller configured to control a plurality of the first bit lines, and a second controller configured to control a plurality of the first source lines.

7. The semiconductor storage device of claim 1, wherein each of the first active areas is provided under two resistance change elements sandwiching two of the first gates which neighbor each other in the first direction, and wherein the second active areas have the same shape as the first active areas.

8. The semiconductor storage device of claim 7, further comprising a discharge circuit including:
a plurality of third cell transistors each including a first end electrically connected to one of the first bit lines or one of the second bit lines, a second end electrically connected to a ground potential, and a third gate electrode extending in the first direction; and
a plurality of third active areas in which the third cell transistors are formed and which have the same shape as the first active areas.

9. The semiconductor storage device of claim 8, wherein the first cell transistors, the second cell transistors, and the third cell transistors have substantially the same size.

10. The semiconductor storage device of claim 7, wherein a predetermined number of the second cell transistors include the first ends which are electrically connected in parallel, and include the second gate electrodes to which the same signal is input.

11. The semiconductor storage device of claim 7, wherein the second area includes a first controller configured to control a plurality of the first bit lines, and a second controller configured to control a plurality of the second bit lines.

12. A semiconductor storage device comprising:
a first area including a plurality of memory cells;
a second area that is adjacent to the first area in a first direction and does not include a plurality of memory cells;
a plurality of first bit lines electrically connected to first ends of the memory cells and extending in the first direction at the first and second areas;
a plurality of first source lines electrically connected to second ends of the memory cells and extending in the first direction at the first and second areas;
a plurality of second bit lines extending in the first direction at the second area, wherein the second bit lines are extensions of the first bit lines;
a plurality of second source lines extending in the first direction at the second area, wherein the second source lines are extensions of the first source lines;
a plurality of first switch transistors which connect the first bit lines and the second bit lines; and
a plurality of second switch transistors which connect the first source lines and the second source lines,
wherein the first area includes a plurality of first active areas in which a plurality of first cell transistors are formed and which extend in a direction crossing the first direction at a first angle, and
wherein the second area includes a plurality of second active areas in which a plurality of second cell transistors are formed and which extend in a direction crossing the first direction at a second angle.

13. The semiconductor storage device of claim 12, further comprising a discharge circuit including:
a plurality of third cell transistors each including a first end electrically connected to one the first bit lines or one of the first source lines, a second end electrically connected to a ground potential, and a gate electrode extending in a second direction, and
a plurality of third active areas in which the third cell transistors are formed and which extend in a direction crossing the first direction at a third angle.

14. The semiconductor storage device of claim 13, wherein the first cell transistors, the second cell transistors, and the third transistors are substantially the same size.

15. The semiconductor storage device of claim 13, wherein the first angle, the second angle, and the third angle are equal.

16. The semiconductor storage device of claim 12, wherein a predetermined number of the second cell transistors include first ends which are electrically connected in parallel, and include gate electrodes to which the same signal is input.

17. The semiconductor storage device of claim 12, wherein the second area includes a first controller configured to control a plurality of the first bit lines, and a second controller configured to control a plurality of the first source lines.

18. The semiconductor storage device of claim 12, further comprising a discharge circuit including:
- a plurality of third cell transistors each including a first end electrically connected to the first bit lines or the second bit lines, a second end electrically connected to a ground potential, and a gate electrode extending in the first direction, and
- a plurality of third active areas in which the third cell transistors are formed and which have the same shape as the first active areas.

19. The semiconductor storage device of claim 18, wherein the first cell transistors, the second cell transistors, and the third cell transistors have substantially the same size.

20. The semiconductor storage device of claim 12, wherein a predetermined number of the second cell transistors include first ends which are electrically connected in parallel, and include gate electrodes to which the same signal is input.

* * * * *